(12) United States Patent
Chang et al.

(10) Patent No.: US 11,837,586 B2
(45) Date of Patent: Dec. 5, 2023

(54) PACKAGE STRUCTURE AND METHOD OF FORMING THEREOF

(71) Applicant: TAIWAN SEMICONDUCTOR MANUFACTURING COMPANY, LTD., Hsinchu (TW)

(72) Inventors: Jen-Yuan Chang, Hsinchu (TW); Sheng-Chih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 58 days.

(21) Appl. No.: 17/351,105

(22) Filed: Jun. 17, 2021

(65) Prior Publication Data

US 2022/0278083 A1 Sep. 1, 2022

Related U.S. Application Data

(60) Provisional application No. 63/154,492, filed on Feb. 26, 2021.

(51) Int. Cl.
| | |
|---|---|
| H01L 25/10 | (2006.01) |
| H01L 23/00 | (2006.01) |
| H01L 23/31 | (2006.01) |
| H01L 23/498 | (2006.01) |
| H01L 21/48 | (2006.01) |
| H01L 21/56 | (2006.01) |
| H01L 25/00 | (2006.01) |

(52) U.S. Cl.
CPC ........ *H01L 25/105* (2013.01); *H01L 21/4853* (2013.01); *H01L 21/4857* (2013.01); *H01L 21/563* (2013.01); *H01L 21/565* (2013.01); *H01L 23/3128* (2013.01); *H01L 23/3135* (2013.01); *H01L 23/49822* (2013.01); *H01L 23/49838* (2013.01); *H01L 24/16* (2013.01); *H01L 25/50* (2013.01); *H01L 2224/16227* (2013.01); *H01L 2924/18161* (2013.01)

(58) Field of Classification Search
None
See application file for complete search history.

(56) References Cited

U.S. PATENT DOCUMENTS

2013/0249532 A1* 9/2013 Lin ................. H01L 23/49838
257/774

* cited by examiner

*Primary Examiner* — Long Pham
(74) *Attorney, Agent, or Firm* — Maschoff Brennan

(57) ABSTRACT

A package structure includes a package substrate, a first die, a second die, a first underfill, and a second underfill. The first die and a second die are disposed on the package substrate. The first underfill is between the first die and the package substrate, and the first underfill includes a first extension portion extending from a first sidewall of the first die toward the second die. The second underfill is between the second die and the package substrate, and the second underfill includes a second extension portion extending from a second sidewall of the second die toward the first die, the second extension portion overlapping the first extension portion on the package substrate.

20 Claims, 19 Drawing Sheets

PACKAGE STRUCTURE AND METHOD OF FORMING THEREOF

PRIORITY CLAIM AND CROSS-REFERENCE

The present application claims priority to U.S. Provisional Application Ser. No. 63/154,492, filed Feb. 26, 2021, which is herein incorporated by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
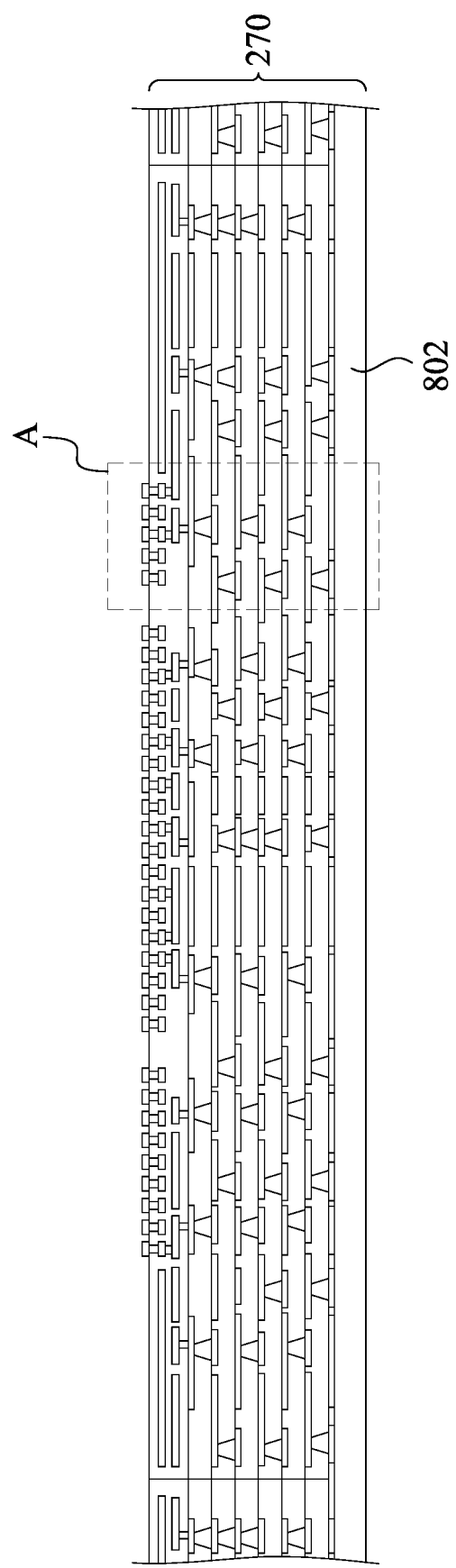
FIGS. 1A to 11 illustrate cross-sectional views of intermediate steps during a process for forming a package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 11 illustrate cross-sectional views of intermediate steps during a process for forming a package structure in accordance with some embodiments.

Figure 1B:
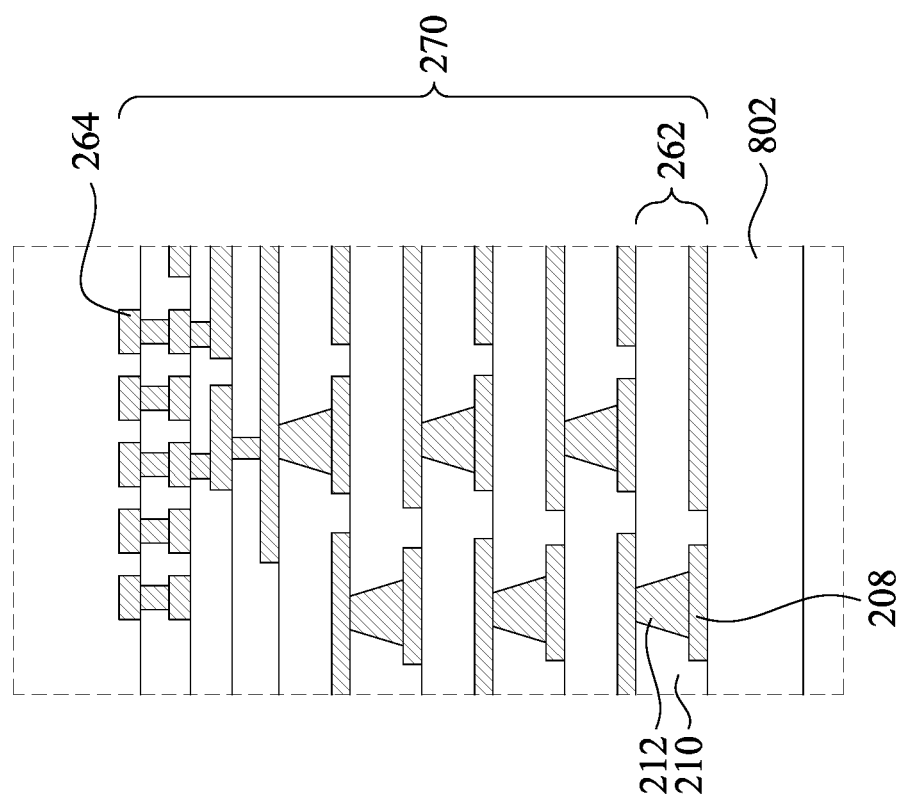

Reference is made to FIGS. 1A and 1B, in which FIG. 1B is an enlarged view of region A of FIG. 1A. Shown there is carrier substrate 802. The carrier substrate 802 may be a glass carrier substrate, a ceramic carrier substrate, or the like. The carrier substrate 802 may be a wafer, such that multiple redistribution structures can be formed on the carrier substrate 802 simultaneously. The carrier substrate 802 may have a release layer (not illustrated) over its top surface. The release layer may be formed of a polymer-based material, which may be removed along with the carrier substrate 802 from the overlying structures that will be formed in subsequent steps. In some embodiments, the release layer is an epoxy-based thermal-release material, which loses its adhesive property when heated, such as a light-to-heat-conversion (LTHC) release coating. In other embodiments, the release layer may be an ultra-violet (UV) glue, which loses its adhesive property when exposed to UV lights. The release layer may be dispensed as a liquid and cured, may be a laminate film laminated onto the carrier substrate 802, or may be the like. The top surface of the release layer may be leveled and be planar within process variations.

A redistribution structure 270 is formed on the carrier substrate 802. Although the embodiments illustrated in accordance with FIGS. 1A and 1B show the redistribution structure 270 with a certain number of redistribution layers, any suitable number of redistribution layers may be formed, such as from one to twenty redistribution layers. The redistribution structure 270 may be subsequently attached components such as e.g. core substrates 300 (see blow, FIG. 4).

In FIG. 1B, the redistribution structure 270 may have a redistribution layer 262 formed on the carrier substrate 802. The redistribution layer 262 may include conductive features such as a conductive lines 208 and conductive vias 212 embedded in a dielectric layer 210. The conductive lines 208 and conductive vias 212 may couple subsequently attached components such as e.g. core substrates 300 (see blow, FIG. 4).

As an example to form the redistribution layer 262, a seed layer may be formed over the carrier substrate 802. In some embodiments, the seed layer is a metal layer, which may be a single layer or a composite layer comprising a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the conductive lines 208. The patterning forms openings through the photoresist to expose the seed layer. A conductive material is then formed in the openings of the photoresist and on the exposed portions of the seed layer.

The conductive material may be formed by plating, such as electroplating or electroless plating, or the like. The conductive material may include a metal, like copper, titanium, tungsten, aluminum, or the like. The combination of the conductive material and underlying portions of the seed layer form the conductive lines 208. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Conductive vias 212 are formed on and extending from the conductive lines 208. As an example to form the conductive vias 212, a photoresist is formed and patterned on the conductive lines 208. The photoresist may be formed by spin coating or the like and may be exposed to light for patterning. The patterning forms openings through the photoresist to expose the conductive lines 208, where the openings in the photoresist correspond to the conductive vias 212. A conductive material is then formed in the openings of the photoresist and on the exposed portions of the conductive lines 208. The conductive material may be formed by plating, such as electroplating or electroless plating, or the like. The conductive material may comprise a metal, like copper, titanium, tungsten, aluminum, or the like. The conductive material forms the conductive vias 212. The photoresist is then removed. The photoresist may be removed by an acceptable ashing or stripping process, such as using an oxygen plasma or the like.

A dielectric layer 210 is formed on and around the conductive lines 208 and the conductive vias 212 in accordance with some embodiments. After formation, the dielectric layer 210 surrounds the conductive vias 212 and conductive lines 208. The dielectric layer 210 and metallization pattern, including conductive vias 212 and conductive lines 208, form the redistribution layer 262. In some embodiments, the dielectric layer 210 is formed of a polymer, such as polybenzoxazole (PBO), polyimide, benzocyclobutene (BCB), or the like. In other embodiments, the dielectric layer 210 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 210 may be formed by acceptable deposition process, such as spin coating, CVD, laminating, the like, or a combination thereof. In still other embodiments, the dielectric layer 210 may be formed of pre-preg, Ajinomoto Build-up Film (ABF), resin coated copper (RCC), molding compound, polyimide, photo-imageable dielectric (PID), epoxy, epoxy molding compound, or the like, and may be applied by compression molding, transfer molding, or the like. The dielectric material may be applied in liquid or semi-liquid form and then subsequently cured to form the dielectric layer 210.

In some embodiments, the dielectric layer 210 is formed such that the conductive lines 208 and conductive vias 212 are buried or covered, and a planarization process is then performed on the dielectric layer 210 to expose the conductive vias 212. Topmost surfaces of the dielectric layer 210 and conductive vias 212 are substantially level (e.g., planar) within process variations after the planarization process. The planarization process may be, for example, a CMP.

Additional redistribution layers of the redistribution structure 270 may be formed over the redistribution layer 262 using the same methods and materials as described above with respect to the redistribution layer 262. The dielectric layers of the additional redistribution layers may be formed using the materials described above with respect to the dielectric layer 210. In some embodiments, some of the additional dielectric layers are formed with a polymer such as e.g. polyimide and some are formed with a molding compound.

Conductive pads 264 may be formed directly on and physically and electrically couple to the conductive vias 212 in the topmost redistribution layer of the redistribution structure 270. The conductive pads 264 may be formed of the same material and method as the conductive lines 208.

Figure 2:
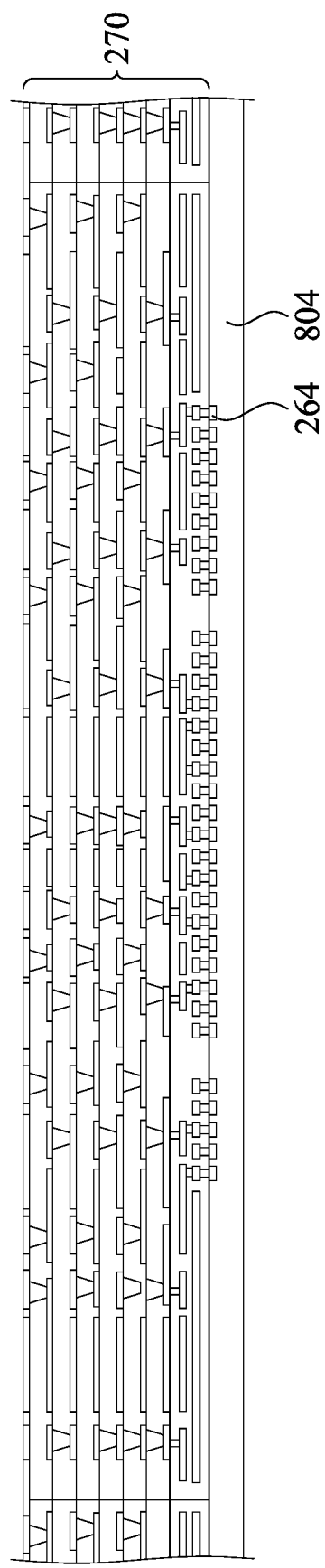

Reference is made to FIG. 2. A de-bonding process is performed to detach (or "de-bond") the carrier substrate 802 (see FIGS. 1A and 1B) from the redistribution structure 270. In accordance with some embodiments, the de-bonding includes projecting a light such as a laser light or an UV light on the release layer (not illustrated) over the carrier substrate 802 so that the release layer decomposes under the heat of the light and the carrier substrate 802 can be removed. The structure is then flipped over and placed on another carrier substrate 804, such as a tape. For example, the conductive pads 264 may be attached to the carrier substrate 804.

Figure 3:
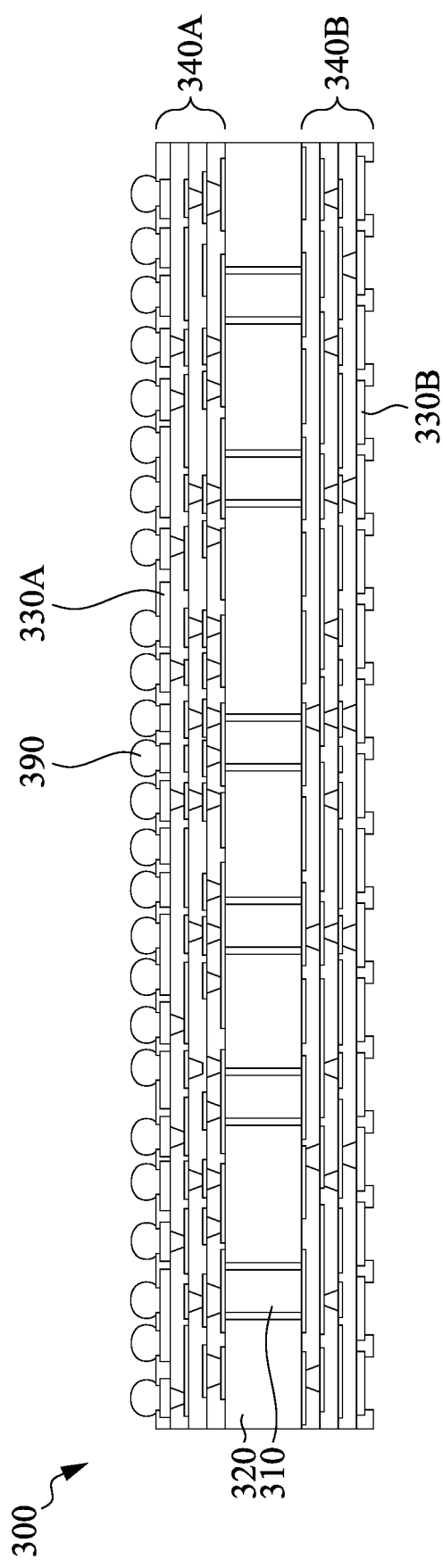

Reference is made to FIG. 3. FIG. 3 illustrates a core substrate 300, which is subsequently bonded with a redistribution structure 270 (see below, FIG. 4). Utilizing the core substrate 300 has the advantage of having the core substrate 300 being manufactured in a separate process. In addition, because core substrate 300 is formed in a separate process, it can be tested separately so that a known good core substrate 300 is used. For example, in some embodiments, the core substrate 300 may be individually or batch tested, validated, and/or verified prior to bonding the core substrate 300 to the redistribution structure 270.

The core substrate 300 may be, e.g., an organic substrate, a ceramic substrate, a silicon substrate, or the like. The conductive connectors 390 are disposed on the core substrate 300, and are used to attach the core substrate 300 to the redistribution structure 270. Attaching the core substrate 300 may include placing the core substrate 300 on the redistribution structure 270 and reflowing the conductive connectors 390 to physically and electrically couple the core substrate 300 and the redistribution structure 270.

Before being attached to the redistribution structure 270, the core substrate 300 may be processed according to applicable manufacturing processes to form redistribution structures in the core substrate 300. For example, the core substrate 300 includes a core 310. The core 310 may be formed of one or more layers of glass fiber, resin, filler, pre-preg, epoxy, silica filler, Ajinomoto Build-up Film (ABF), polyimide, molding compound, other materials, and/or combinations thereof. In some embodiments, for example, two layers of material make up the core 310. The core 310 may be formed of organic and/or inorganic materials. In some embodiments, the core 310 includes one or more passive components (not shown) embedded inside. The core 310 may include other materials or components. Conductive vias 320 are formed extending through the core 310. In some embodiments, the conductive vias 320 may include a conductive material such as copper, a copper alloy, or other conductors, metals, and may include a barrier layer (not shown), liner (not shown), seed layer (not shown). The conductive vias 320 provide vertical electrical connections from one side of the core 310 to the other side of the core 310. For example, some of the conductive vias 320 are coupled between conductive features at one side of the core 310 and conductive features at an opposite side of the core 310. Holes for the conductive vias 320 may be formed using a drilling process, photolithography, a laser process, or other methods, as examples, and the holes of the conductive vias 320 are then filled or plated with conductive material. In some embodiments, the conductive vias 320 are hollow conductive through vias having centers that are filled with an insulating material.

In some embodiments, redistribution structures 340A and 340B are formed on opposite sides of the core 310. The redistribution structures 340A and 340B are electrically coupled by the conductive vias 320, and fan-in/fan-out electrical signals. The redistribution structures 340A and 340B each may include dielectric layers, formed of ABF, pre-preg, or the like, and metallization patterns. Each respective metallization pattern has line portions on and extending along a major surface of a respective dielectric layer, and has via portions extending through the respective dielectric layer. The redistribution structures 340A and 340B each, respectively, include under-bump metallurgies (UBMs) 330A and 330B for external connection. The redistribution structure 340A may subsequently be attached to the redistribution structure 270 by the UBMs 330A through the conductive connectors 390 as illustrated below in FIG. 4. More or fewer dielectric layers and metallization patterns may be formed in the redistribution structures 340A and 340B than shown in FIG. 3.

The core substrate 300 may include active and passive devices (not shown), or may be free from either active devices, passive devices, or both. A wide variety of devices such as transistors, capacitors, resistors, inductors, combinations of these, and the like may be used. The devices may be formed using any suitable methods.

The conductive connectors 390 on the core substrates 300 may be used to bond the core substrates 300 to the redistribution structure 270. In some embodiments, conductive connectors 390 may be first formed on either the core substrates 300, and then reflowed to complete the bond. For example, in the embodiments shown in FIG. 3, conductive connectors 390 are formed on UBMs 330A of the redistribution structure 340A. The conductive connectors 390 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 390 may include a conductive material such as solder, copper, aluminum, gold, nickel, silver, palladium, tin, the like, or a combination thereof. Integration of such conductive connectors 390 may provide flexibility in placement for semiconductor devices, such as integrated passive device (IPD) chips, integrated voltage regulators (IVRs), active chips, among other electrical components, to implement system-on-a-chip type of package substrates, thus reducing fabrication complexity. Such embodiments may also provide a greater amount of flexibility for various other package configurations as well.

In some embodiments, the conductive connectors 390 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 390 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 4:
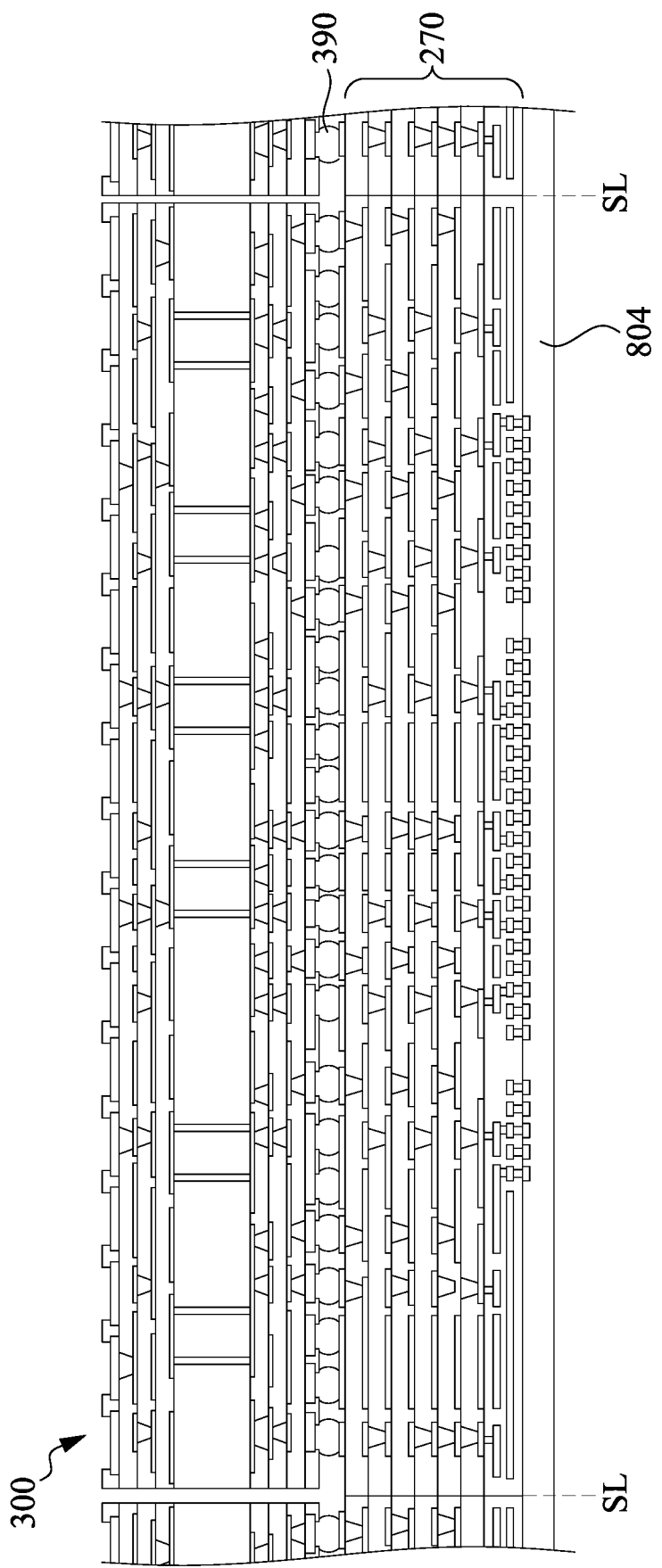

Reference is made to FIG. 4. A plurality of core substrates 300 are bonded to the redistribution structure 270 in different package regions, respectively. In some embodiments, the core substrates 300 may be placed on the redistribution structure 270 using a pick and place process or another suitable process and the conductive connectors 390 bonded by flip chip bonding process or other suitable bonding process. In some embodiments, the conductive connectors 390 are reflowed to attach the core substrates 300 to the redistribution structure 270. The conductive connectors 390 electrically and/or physically couple the core substrates 300 to the redistribution structure 270. Here, the each package region is defined by two scribe lines SL. In a singulation process (see FIG. 6), the structure may be sawed along the scribe lines SL to separate different package regions.

Figure 5:
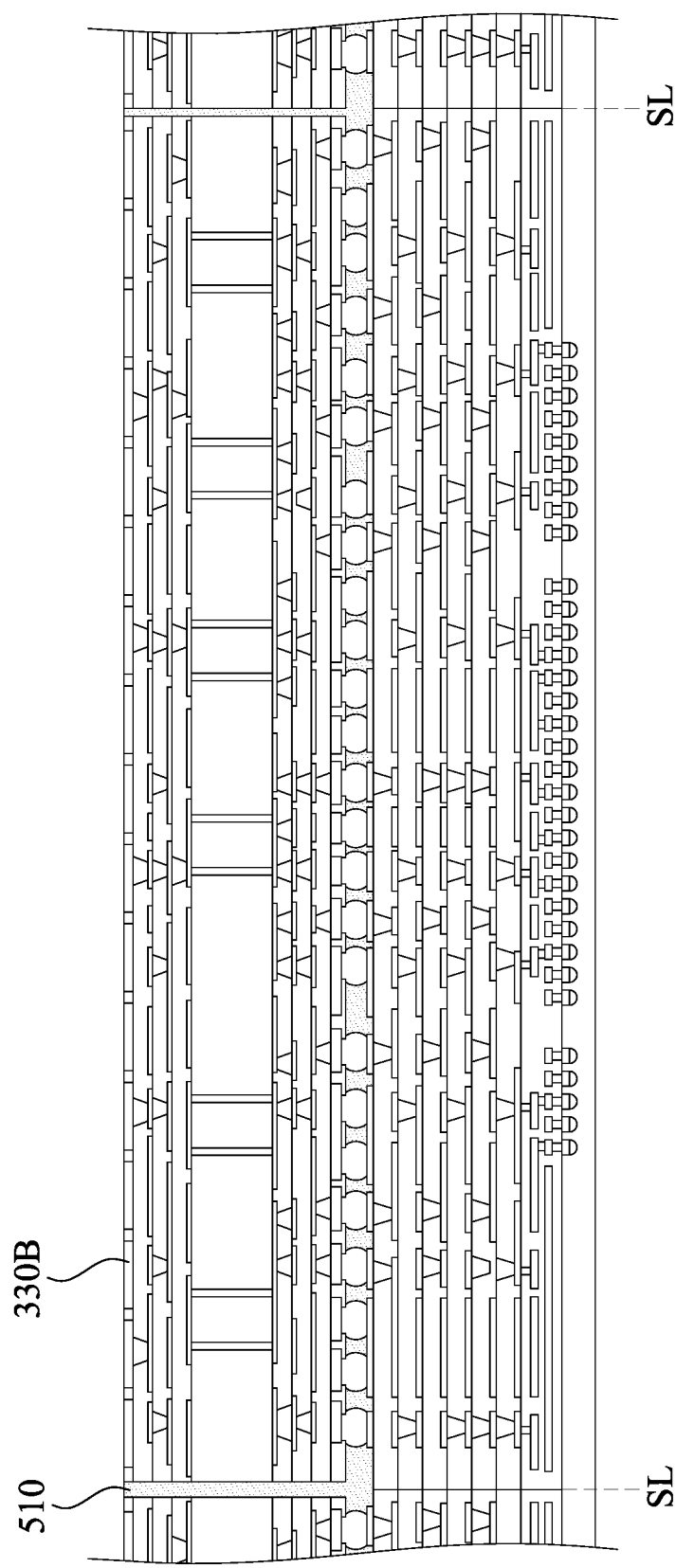

Reference is made to FIG. 5. An encapsulation is performed by forming encapsulant 510 on and around the various components. After formation, the encapsulant 510 surrounds the core substrates 300, including conductive connectors 390. The encapsulant 510 may be formed of or including a molding compound, epoxy, an underfill, a molding underfill, the like, or a combination thereof and may be applied by compression molding, transfer molding, or the like. The encapsulant 510 may be applied in liquid or semi-liquid form and then subsequently cured. The encapsulant 510 may be formed such that core substrates 300 are buried or covered.

A planarization process may be performed, if necessary, on the encapsulant 510 to expose the UBMs 330B of the core substrates 300. Topmost surfaces of the encapsulant 510 and UBMs 330B are level (e.g., planar) after the planarization process within process variations. The planarization process may be, for example, a chemical-mechanical polish (CMP), a grinding process, or the like. In some embodiments, the planarization may be omitted, for example, if the UBMs 330B are already exposed. Other processes may be used to achieve a similar result. For example, a dielectric or passivation layer may be formed over UBMs 330 prior to forming the encapsulant 510. In such cases, the dielectric or passivation layer may be patterned in a subsequent step to expose portions of the UBMs 330B.

Figure 6:
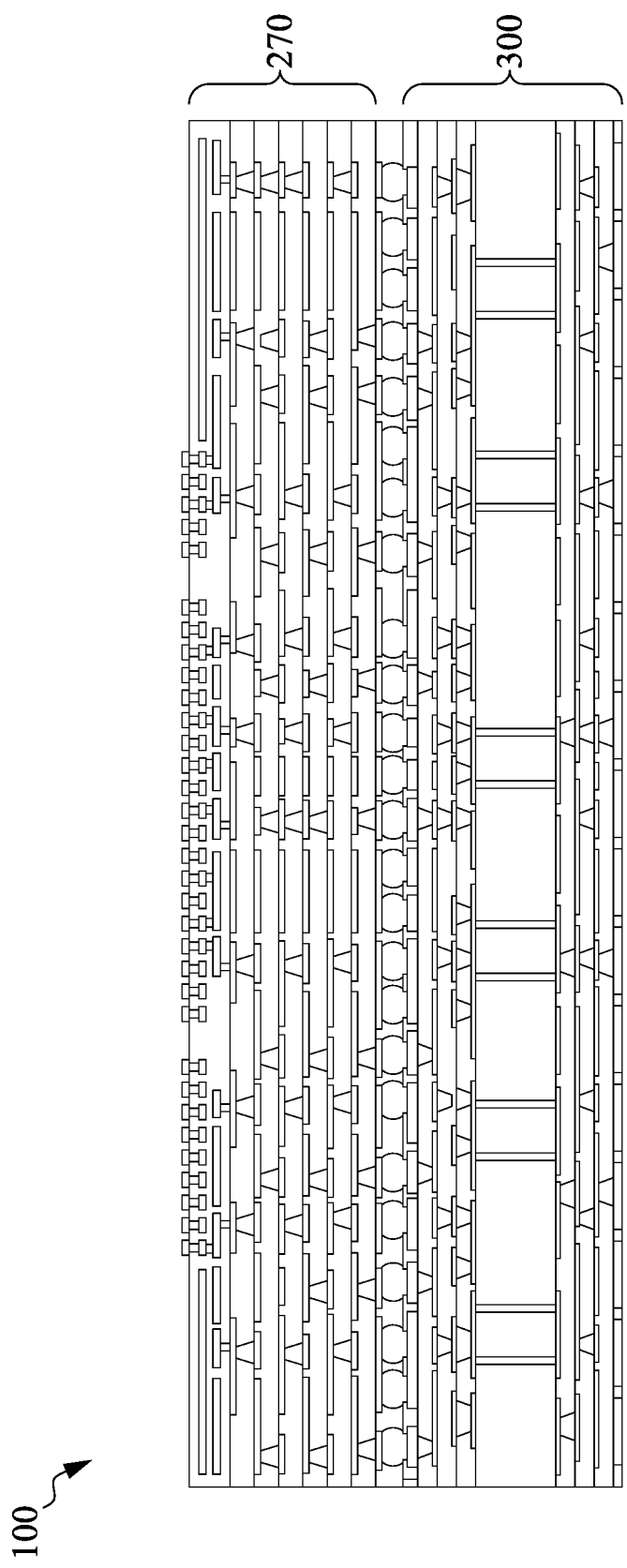

Reference is made to FIG. 6. A singulation process is performed by sawing along scribe line regions, e.g., the scribe lines SL shown in FIGS. 4 and 5. The sawing singulates a package region from adjacent package regions to form multiple singulated package substrates 100. Furthermore, the carrier substrate 804 (see FIG. 5) may also be removed.

Figure 7A:
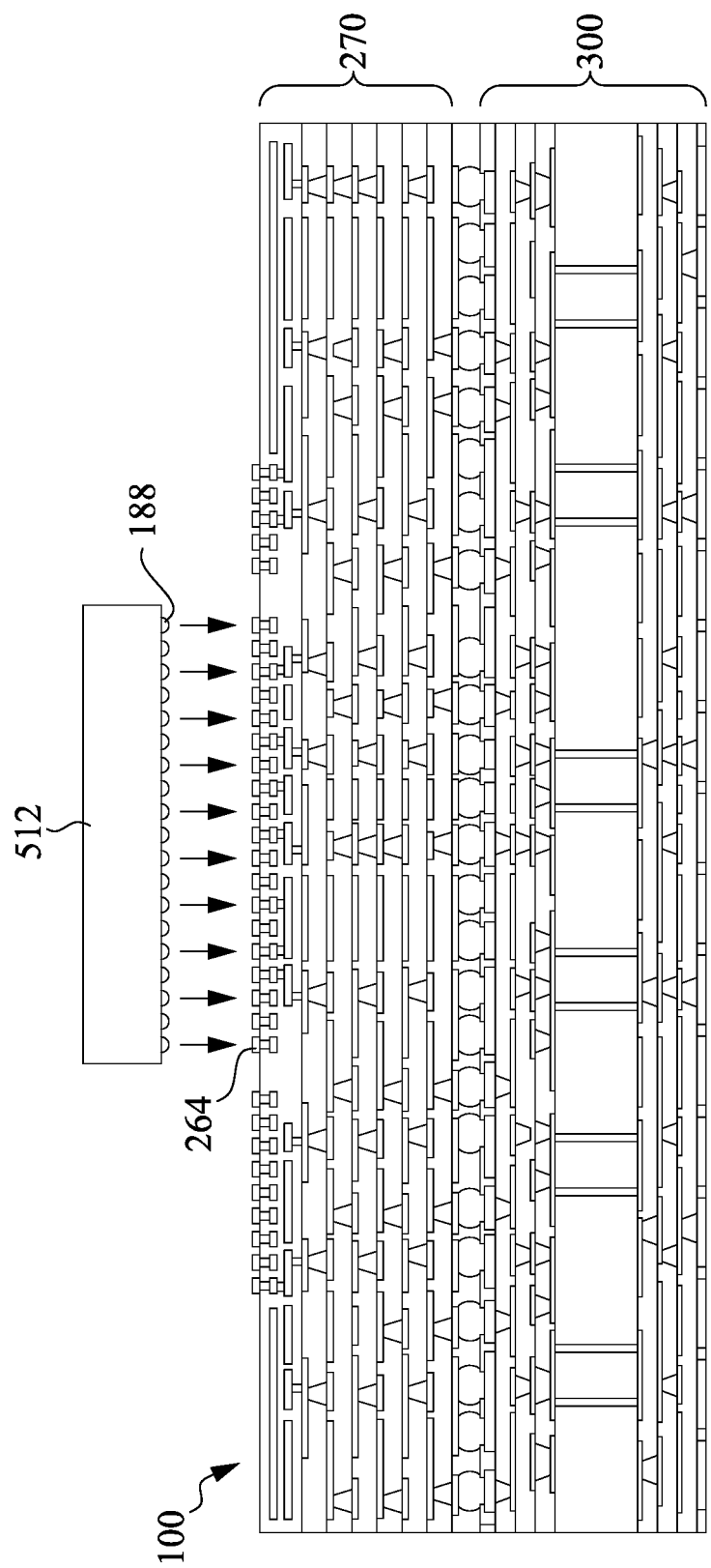
Figure 7B:
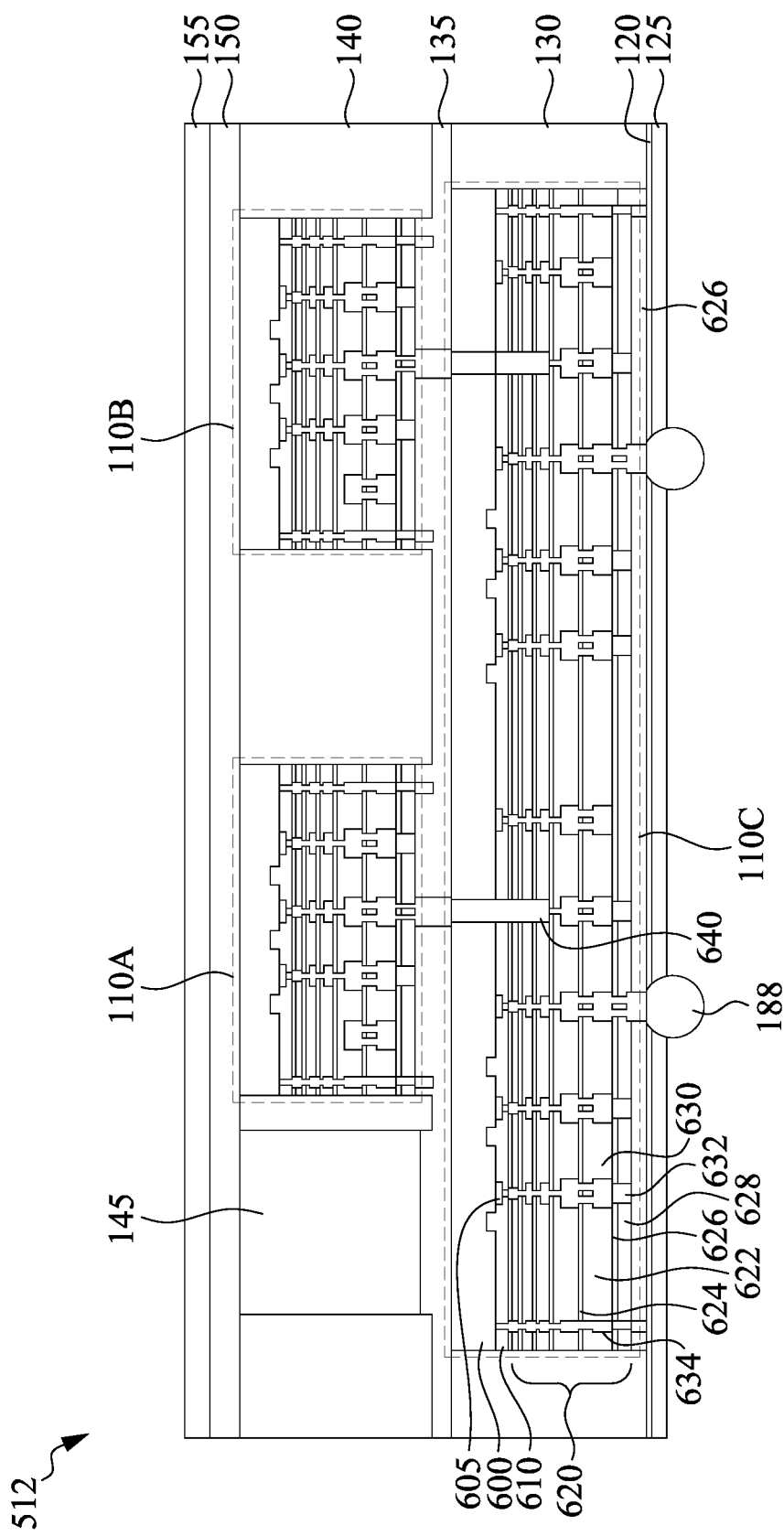

Reference is made to FIGS. 7A and 7B, in which FIG. 7B is an enlarged view of the integrated circuit die 512 shown in FIG. 7A. An integrated circuit die 512 is attached to the redistribution structure 270 of the package substrate 100. In some embodiments, the integrated circuit die 512 includes conductive connectors 188, and each conductive connector 188 may be aligned with a respective conductive pad 264 on the redistribution structure 270 and then be placed on the respective conductive pad 264. In some embodiments, the conductive connectors 188 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 188 may include a conductive material such as solder, copper, aluminum, gold, nickel, silver, palladium, tin, the like, or a combination thereof. In some embodiments, the conductive connectors 188 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 188 include metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Reference is made to FIG. 7B. In some embodiments, the integrated circuit die 512 may be a System-on-Integrated-Chip (SoIC). For example, the integrated circuit die 512 may include first and second chips 110A and 110B over a third chip 110C. In some embodiments, the first and second chips 110A and 110B may be memory chips, such as DRAM chips, SRAM chips, other suitable memory chips, or combination thereof. In some embodiments, the third chip 110C may be a logic chip.

As an example of the third chip 110C, the third chip 110C may include a substrate 600. In some embodiments, the substrate 600 may be a silicon substrate, or other suitable substrate materials. Devices 605 are disposed on the substrate 600. In some embodiments, each of the devices 605 may be a transistor, such as a MOSFET, while other devices may also be employed. A front-end-of-line (FEOL) interlayer dielectric (ILD) layer 610 is disposed on the substrate 600 and covers the devices 605. In some embodiments, the ILD layer 610 may include phospho silicate glass (PSG), SiO$_2$, or other suitable materials. A back-end-of-line (BEOL) interconnect structure 620 is disposed on the ILD layer 610. The interconnect structure 620 may include dielectric layers 622 and etch stop layers 624 alternately stacked on each other. In some embodiments, the dielectric layers 622 may include undoped silicate glass (USG), low-k dielectric material, extreme low-k dielectric material, SiO$_2$, or other suitable materials. In some embodiments, the etch stop layers 624 may include SiN, SiC, or other suitable materials. The interconnect structure 620 further includes a passivation layer 626 disposed on the dielectric layers 622. In some embodiments, the passivation layer 626 may include SiN, USG, SiO$_2$, or other suitable materials. A dielectric layer 628 is disposed on the passivation layer 626. In some embodiments, the dielectric layer 628 may include TEOS, SiO$_2$, or other suitable materials.

A plurality of conductive features 630 penetrate the interconnect structure 620 and are electrically connected to respective devices 605. In some embodiments, each of the conductive features 630 may include metal lines and conductive vias, and may be made of Cu, or other suitable materials. In some embodiments, parts of the conductive features 630 are in contact with the conductive connectors 188, and may be electrically connected to the devices 605. Conductive pads 632 are disposed in the dielectric layer 628 and are electrically connected to the conductive features 630. A plurality of seal rings 634 penetrate through the interconnect structure 620 and enclose the conductive features 630, or other interconnect features in the interconnect structure 620 in the active region. In some embodiments, the seal rings 634 may include Cu, or other suitable materials.

The third chip 110C is disposed over a passivation layer 120 via a hybrid bonding film 160. In some embodiments, the passivation layer 120 may include SiN, USG, SiO$_2$, or other suitable materials. The hybrid bonding film 160 may include SiO$_2$, or other suitable materials. The passivation layer 120 is disposed over a fusion bonding film 125. In some embodiments, the fusion bonding film 125 may include SiON, SiO$_2$, or other suitable materials. The conductive connectors 188 may penetrate through the passivation layer 120 and the fusion bonding film 125 and may be electrically connected to the third chip 110C. The third chip 110C is laterally surrounded by a dielectric layer 130. In some embodiments, the dielectric layer 130 may include undoped silicate glass (USG), low-k dielectric material, extreme low-k dielectric material, SiO$_2$, or other suitable materials.

The first and second chips 110A and 110B may have similar structures as the third chip 110C, and thus relevant structural details will not be repeated for simplicity. The first and second chips 110A and 110B are disposed over the dielectric layer 130 with a hybrid bonding film 135 interposed therebetween. In some embodiments, the hybrid bonding film 135 may include SiO$_2$, or other suitable materials. In some embodiments, a dummy structure 145 is disposed over the hybrid bonding film 135. The dummy structure 145 may include silicon, or other suitable materials. The first and second chips 110A and 110B are laterally surrounded by a dielectric layer 140. In some embodiments, the dielectric layer 140 may include undoped silicate glass (USG), low-k dielectric material, extreme low-k dielectric material, SiO$_2$, or other suitable materials.

A plurality of conductive vias 640 penetrate the substrate 600 of the third chip 110C and the interconnect structure 620 of the third chip 110C and electrically connect the third chip 110C to the first and second chips 110A and 110B, respectively. In some embodiments, the conductive vias 640 may be referred to as through-silicon-vias (TSVs), through-oxide-vias (TOVs), and may be made of Cu, or other suitable materials. In some embodiments, the first and second chips 110A and 110B may include conductive features that extend through the hybrid bonding film 135 and in contact with the conductive vias 640, so as to provide electrical connection between the third chip 110C and the first and second chips 110A, 110B.

A carrier substrate 155 is disposed over the first and second chips 110A and 110B with a fusion bonding film 150 interposed therebetween. In some embodiments, the carrier substrate 155 may be a silicon substrate, or other suitable substrate materials. In some embodiments, the fusion bonding film 150 may include SiON, SiO$_2$, or other suitable materials.

Figure 8A:
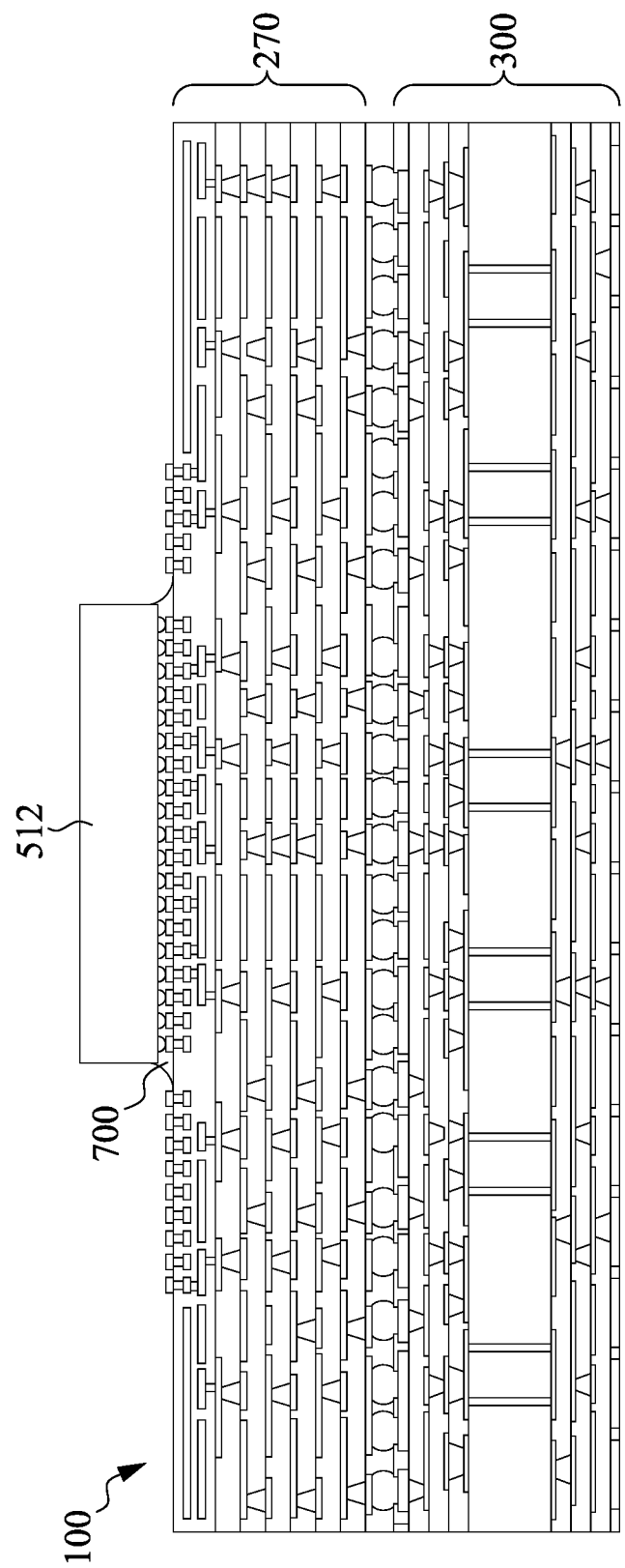
Figure 8B:
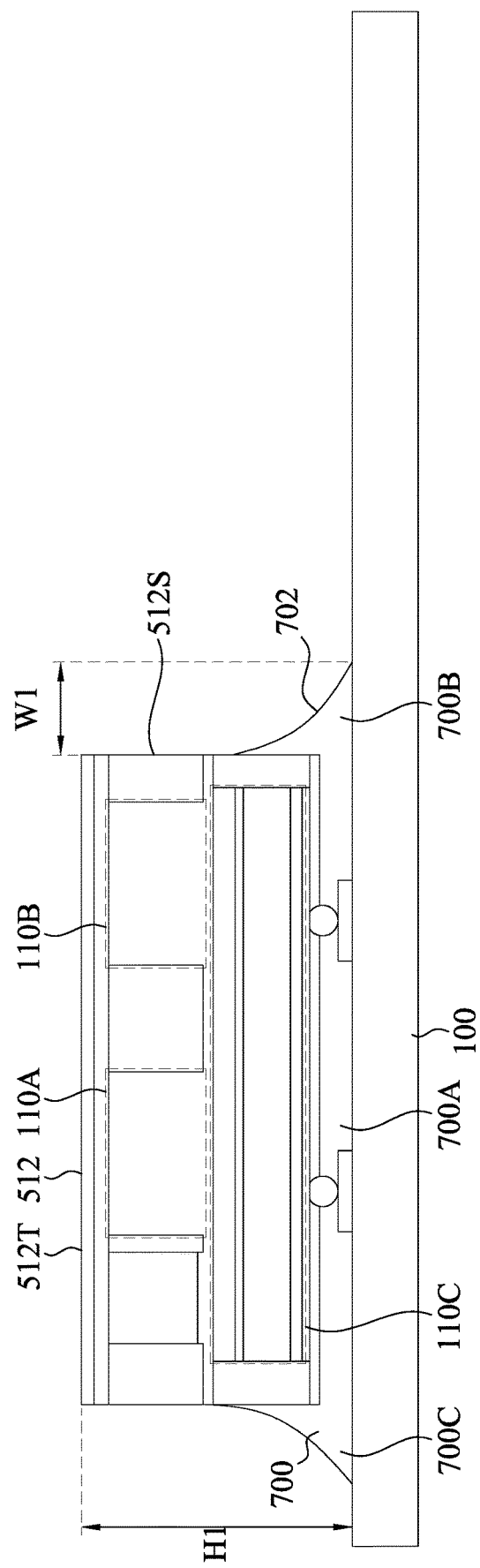

Reference is made to FIGS. 8A and 8B. An underfill 700 is formed surrounding the conductive connectors 188 between the integrated circuit die 512 and the package substrate 100. The underfill 700 may reduce stress and protect the joints resulting from the reflowing of the conductive connectors 188, and may also provide structural support and environmental protection to the integrated circuit die 512. The underfill 700 may be formed by a capillary flow process after the integrated circuit die 512 is attached, or may be formed by a suitable deposition method. In some embodiments, the underfill 700 may be a liquid epoxy that is dispensed between integrated circuit die 512 and the package substrate 100, and then cured to harden, for example, by a thermal curing process. The curing may be performed at a temperature in the range between about 100° C. and about 165° C., for example, for a period of time in the range between about 30 minutes and about 120 minutes. After the curing, the underfill 700 is solidified. In some embodiments, the underfill 700 includes an epoxy-based resin with fillers dispersed therein. The fillers may include fibers, particles, other suitable elements, a combination thereof, or the like.

FIG. 8B is an enlarged view of FIG. 8A, in which some elements of the package substrate 100 are omitted for brevity. In FIG. 8B, the underfill 700 may include a filling portion 700A and extension portions 700B, 700C on opposite sides of the filling portion 700A. The filling portion 700A and the extension portions 700B, 700C may be formed of a continuous material and may not include interfaces therebetween. Here, the filling portion 700A may be defined as the portion of the underfill 700 that is vertically beneath the integrated circuit die 512, and is vertically between the bottom surface of the integrated circuit die 512 and the top surface of the package substrate 100. The extension portions 700B, 700C may be defined as the portions of the underfill 700 that extend, laterally and outwardly, from the sidewall (e.g., sidewall 512S) of the integrated circuit die 512.

As an example of the extension portion 700B, the extension portion 700B may include a lateral width W1. Here, the "laterally width" of the extension portion 700B may be defined as a lateral distance between the vertical sidewall 512S of the integrated circuit die 512 and a farthest end of the extension portion 700B from the sidewall 512S of the integrated circuit die 512. In some embodiments, the extension portion 700B may be referred to as a "fillet weld" of the underfill 700, and thus the lateral width W1 may also be referred to as "fillet width" of the underfill 700. In some embodiments, the extension portion 700B may have a curved surface 702 extending from the sidewall 512S of the integrated circuit die 512 to the top surface of the package substrate 100. That is, one end of the curved surface 702 of the extension portion 700B is in contact with the sidewall 512S of the integrated circuit die 512, and the other end of the curved surface 702 of the extension portion 700B is in contact with the top surface of the package substrate 100. In some embodiments, the curved surface of the extension portion 700B is a concave surface. The top most end of the extension portion 700B may be lower than the top surface of the third chip 110C of the integrated circuit die 512. The extension portion 700C may have substantially the same profile as the extension portion 700B, and thus relevant structural will not be repeated for simplicity. In some embodiments, the extension portions 700B and 700C may have substantially symmetrical profiles.

The integrated circuit die 512 includes a height H1. Here, the "height" of the integrated circuit die 512 may be defined as a vertical distance between the top surface 512T of the integrated circuit die 512 and a top surface of the package substrate 100. In some embodiments, the height H1 of the integrated circuit die 512 is greater than about 9-11 times (e.g., 10 times) the lateral width W1 of the extension portion 700B of the underfill 700.

Figure 9A:
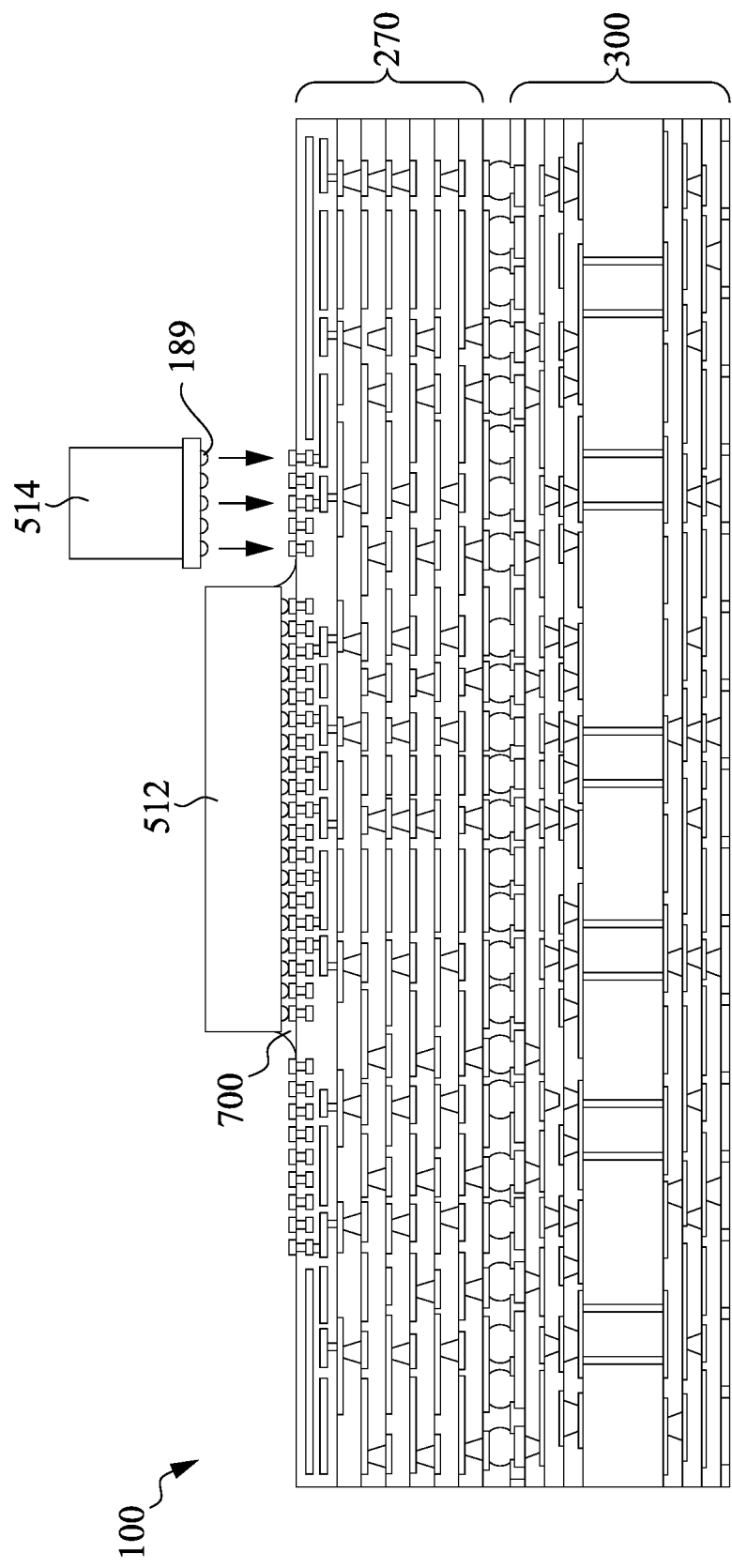
Figure 9B:
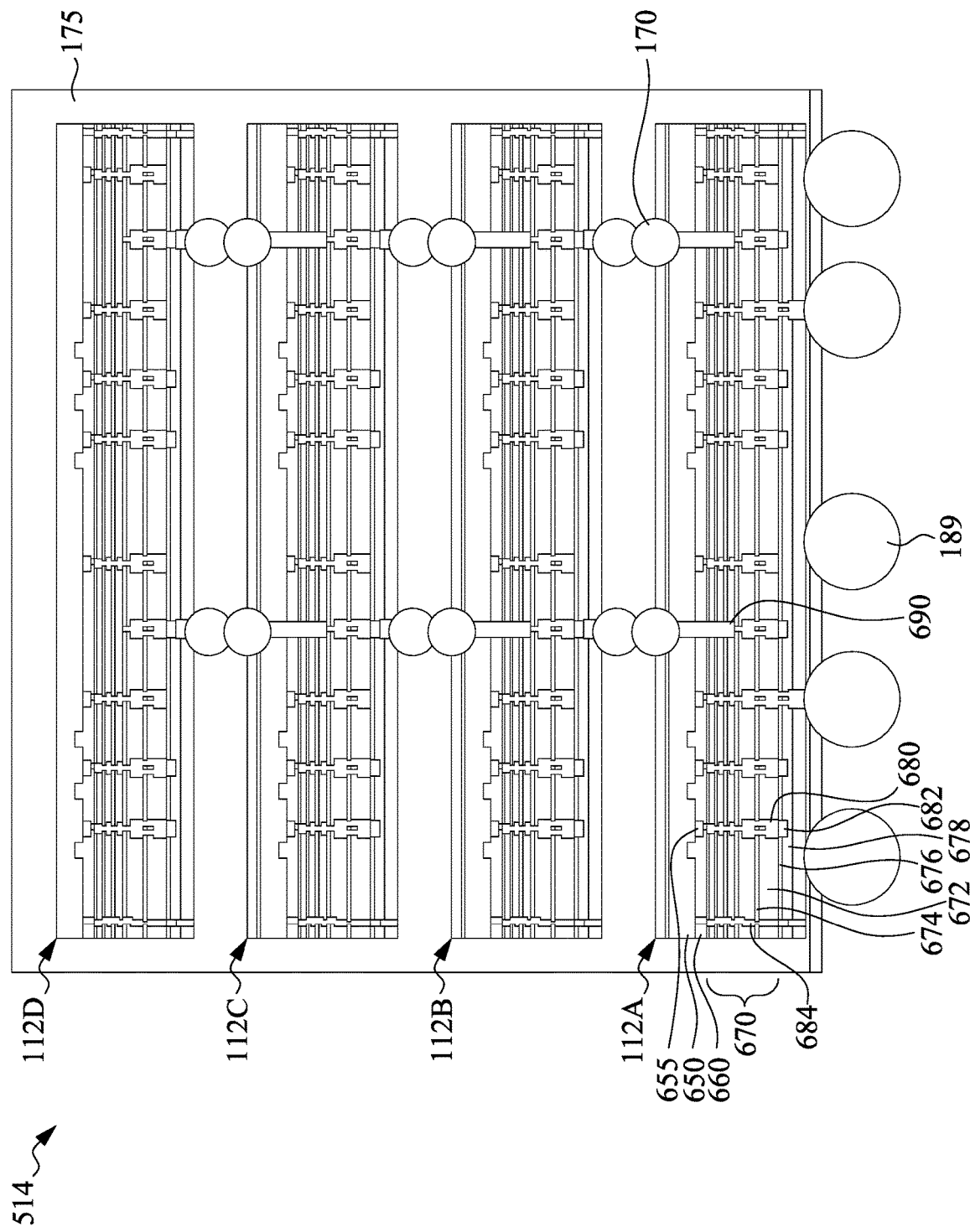

Reference is made to FIGS. 9A and 9B, in which FIG. 9B is an enlarged view of the integrated circuit die 514 shown in FIG. 9A. An integrated circuit die 514 is attached to the redistribution structure 270 of the package substrate 100. In some embodiments, the integrated circuit die 514 includes conductive connectors 189, and each conductive connector 189 may be aligned with and then be placed on a corresponding conductive pad 264 on the redistribution structure 270. In some embodiments, the conductive connectors 188 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 188 may include a conductive material such as solder, copper, aluminum, gold, nickel, silver, palladium, tin, the like, or a combination thereof. In some embodiments, the conductive connectors 188 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 188 include metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

The integrated circuit die 514 may include one or more memory chips, such as a stack of memory chips (e.g., DRAM chips, SRAM chips, High-Bandwidth Memory (HBM) chips, Hybrid Memory Cubes (HMC) chips, or the like). For example, in the stack of integrated circuit chip 514, the integrated circuit chip 514 may include a first chip 112A, a second chip 112B over the first chip 112A, a third chip 112C over the second chip 112B, and a fourth chip 112D over the third chip 112C. In some embodiments, the first chip 112A may be a logic chip, and the second, third, and fourth chips 112B, 112C, 112D may be memory chips.

In some embodiments, conductive connectors 170 are disposed between two adjacent chips of the first, second, third, and fourth chips 112A, 112B, 112C, 112D, so as to provide electrical connection between the two adjacent chips. The material of the conductive connectors 170 may be similar to the material of the conductive connectors 189. In some embodiments, a molding material 175 may encapsulates the first, second, third, and fourth chips 112A, 112B, 112C, 112D in the integrated circuit die 514 and provides structural support to the integrated circuit die 514. In some embodiments, the molding material 175 may include organic polymer, or other suitable materials.

Take the first chip 112A as an example, the first chip 112A may include a substrate 650. In some embodiments, the substrate 650 may be a silicon substrate, or other suitable substrate materials. Devices 655 are disposed on the substrate 650. In some embodiments, each of the devices 655 may be a transistor, such as a MOSFET, while other devices may also be employed. A front-end-of-line (FEOL) interlayer dielectric (ILD) layer 660 is disposed on the substrate 650 and covers the devices 655. In some embodiments, the ILD layer 660 may include phospho silicate glass (PSG), $SiO_2$, or other suitable materials. A back-end-of-line (BEOL) interconnect structure 670 is disposed on the ILD layer 660. The interconnect structure 670 may include dielectric layers 672 and etch stop layers 674 alternately stacked on each other. In some embodiments, the dielectric layers 672 may include undoped silicate glass (USG), low-k dielectric material, extreme low-k dielectric material, $SiO_2$, or other suitable materials. In some embodiments, the etch stop layers 674 may include SiN, SiC, or other suitable materials. The interconnect structure 670 further includes a passivation layer 676 disposed on the dielectric layers 672.

In some embodiments, the passivation layer 676 may include SiN, USG, SiO$_2$, or other suitable materials. A dielectric layer 678 is disposed on the passivation layer 676. In some embodiments, the dielectric layer 678 may include TEOS, SiO$_2$, or other suitable materials.

A plurality of conductive features 680 penetrate through the interconnect structure 670 and are electrically connected to respective devices 655. In some embodiments, each of the conductive features 680 may include metal lines and conductive vias, and may be made of Cu, or other suitable materials. In some embodiments, parts of the conductive features 680 are in contact with the conductive connectors 189, and may be electrically connected to the devices 655. Conductive pads 682 are disposed in the dielectric layer 678 and are electrically connected to the conductive features 680. A plurality of seal rings 684 penetrate through the interconnect structure 670 and enclose the conductive features 680, or other interconnect features in the interconnect structure 670 in the active region. In some embodiments, the seal rings 684 may include Cu, or other suitable materials.

The first chip 112A is disposed over a passivation layer 122 via a hybrid bonding film 162. In some embodiments, the passivation layer 122 may include SiN, USG, SiO$_2$, or other suitable materials. The hybrid bonding film 162 may include SiO$_2$, or other suitable materials. The passivation layer 122 is disposed over a fusion bonding film 126. In some embodiments, the fusion bonding film 125 may include SiON, SiO$_2$, or other suitable materials. The conductive connectors 188 may penetrate through the passivation layer 120 and the fusion bonding film 125 and may be electrically connected to the third chip 110C. The third chip 110C is laterally surrounded by a dielectric layer 130. In some embodiments, the dielectric layer 130 may include undoped silicate glass (USG), low-k dielectric material, extreme low-k dielectric material, SiO$_2$, or other suitable materials.

The second, third, and fourth chips 112B, 112C, 112D may have similar structures as the first chip 112A, and thus relevant structural details will not be repeated for simplicity.

Figure 10A:
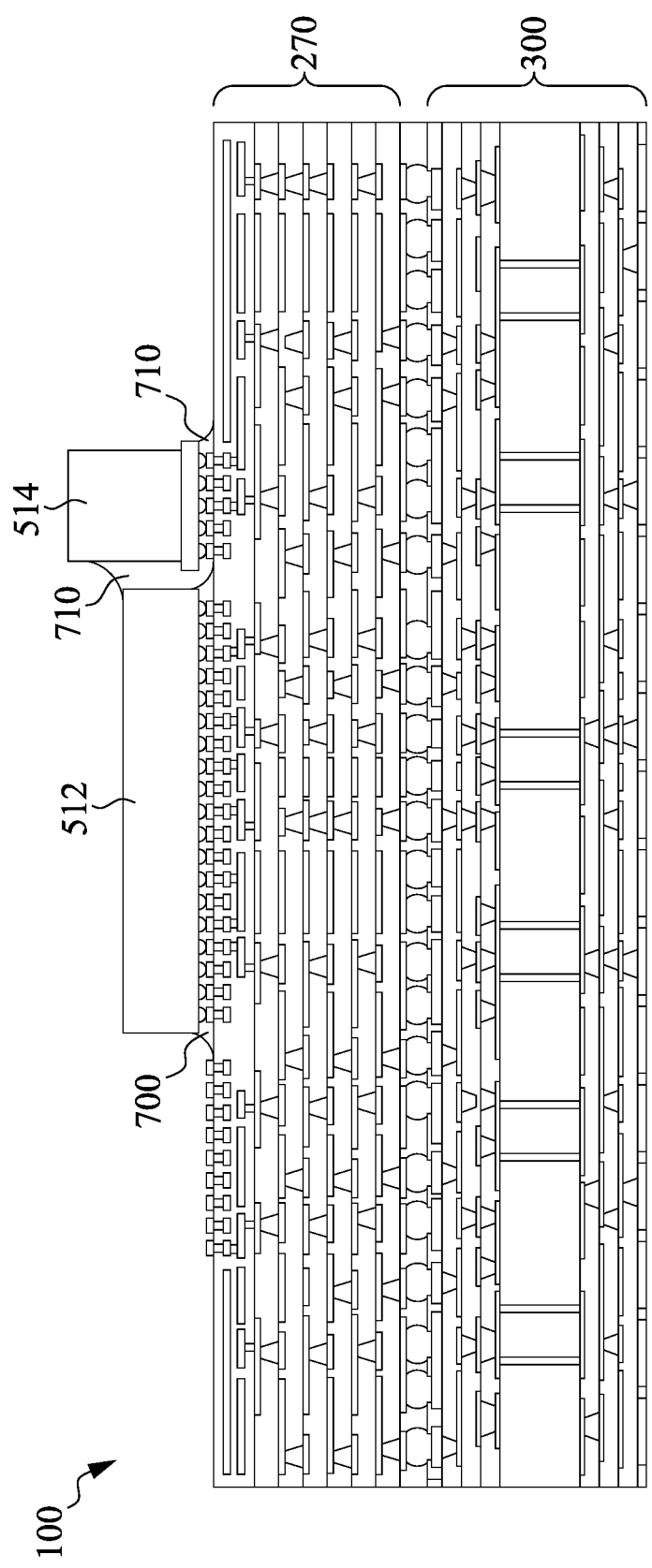
Figure 10B:
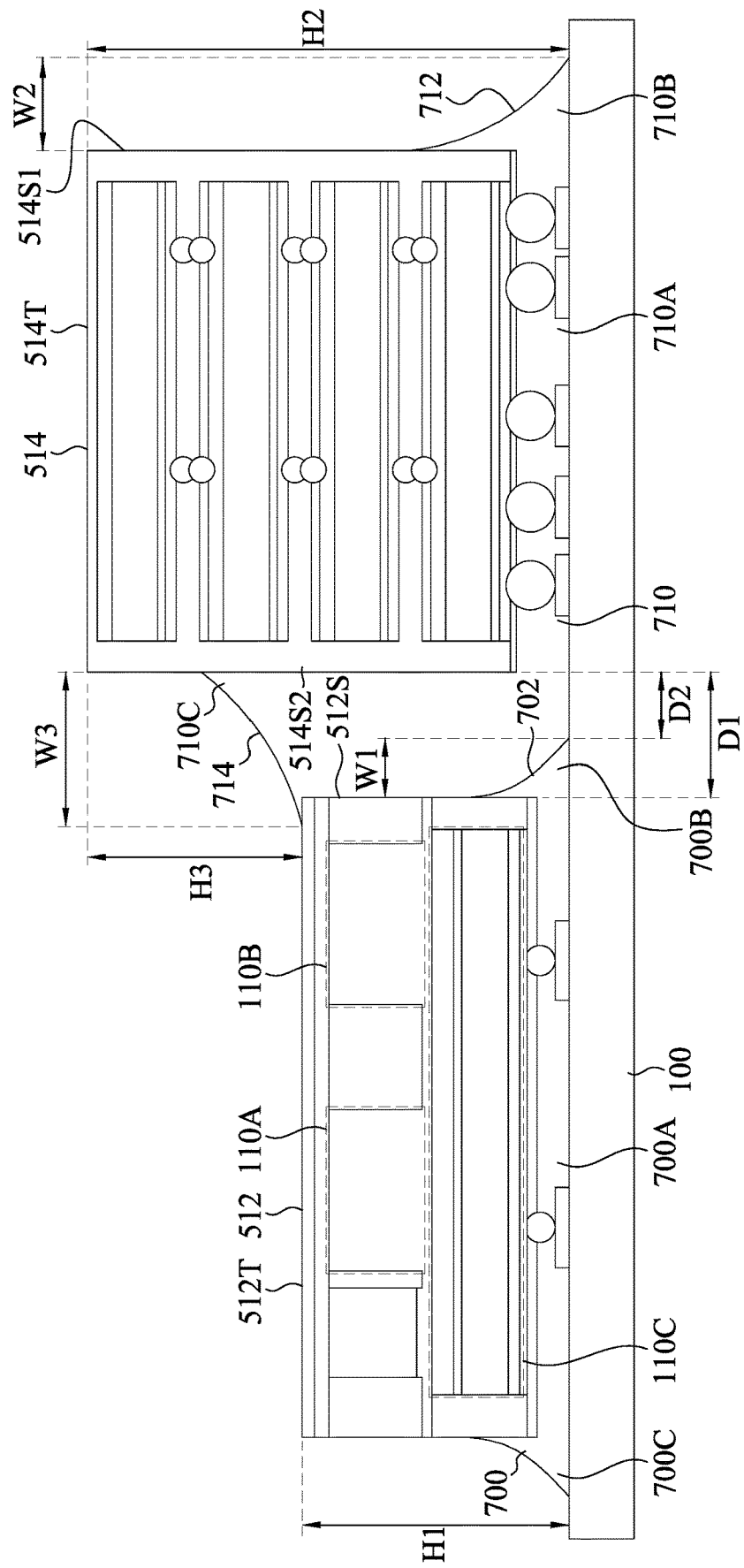

Reference is made to FIGS. 10A and 10B. An underfill 710 is formed surrounding the conductive connectors 189 between the integrated circuit die 514 and the package substrate 100. The underfill 710 may reduce stress and protect the joints resulting from the reflowing of the conductive connectors 189, and may also provide structural support and environmental protection to the integrated circuit die 514. The underfill 710 may be formed by a capillary flow process after the integrated circuit die 514 is attached, or may be formed by a suitable deposition method. In some embodiments, the underfill 710 may be a liquid epoxy that is dispensed between integrated circuit die 514 and the package substrate 100, and then cured to harden, for example, by a thermal curing process. The curing may be performed at a temperature in the range between about 100° C. and about 165° C., for example, for a period of time in the range between about 30 minutes and about 120 minutes. After the curing, the underfill 710 is solidified. In some embodiments, the underfill 710 includes an epoxy-based resin with fillers dispersed therein. The fillers may include fibers, particles, other suitable elements, a combination thereof, or the like.

FIG. 10B is an enlarged view of FIG. 10A, in which some elements of the package substrate 100 are omitted for brevity. In FIG. 10B, the underfill 710 may include a filling portion 710A and extension portions 710B, 710C on opposite sides of the filling portion 710A. The filling portion 710A and the extension portions 710B, 710C may be formed of a continuous material and may not include interfaces therebetween. Here, the filling portion 710A may be defined as the portion of the underfill 710 that is vertically beneath the integrated circuit die 514, and is vertically between the bottom surface of the integrated circuit die 514 and the top surface of the package substrate 100. The extension portions 710B, 710C may be defined as the portions of the underfill 710 that extend, laterally and outwardly, from the sidewall (e.g., sidewalls 514S1 and/or 514S2) of the integrated circuit die 514. In some embodiments, a height difference between the extension portions 710B, 710C of the underfill 710 is greater than a height difference between the extension portions 700B, 700C of the underfill 700.

With respect to the extension portion 710B of the underfill 710, the extension portion 710B may include a lateral width W2. Here, the "laterally width" of the extension portion 710B may be defined as a lateral distance between the vertical sidewall 514S1 of the integrated circuit die 514 and a farthest end of the extension portion 710B from the sidewall 514S1 of the integrated circuit die 514. In some embodiments, the extension portion 710B may be referred to as a "fillet weld" of the underfill 710, and thus the lateral width W2 may also be referred to as "fillet width" of the underfill 710. In some embodiments, the lateral width W2 of the extension portion 710B of the underfill 710 may be greater than the lateral width W1 of the extension portion 700B of the underfill 700. In some embodiments, the extension portion 710B may have a curved surface 712 extending from the sidewall 514S1 of the integrated circuit die 514 to the top surface of the package substrate 100. That is, one end of the curved surface 712 of the extension portion 710B is in contact with the sidewall 514S1 of the integrated circuit die 514, and the other end of the curved surface 712 of the extension portion 710B is in contact with the top surface of the package substrate 100. In some embodiments, the curved surface 712 of the extension portion 710B is a concave surface. In some embodiments, the top most end of the extension portion 710B of the underfill 710 may be higher than the top most end of the extension portion 700B of the underfill 700. In some embodiments, the length of the curved surface 712 of the extension portion 710B of the underfill 710 may be greater than the length of the curved surface 702 of the extension portion 700B of the underfill 700.

With respect to the extension portion 710C of the underfill 710, the extension portion 710C covers the extension portion 710B of the underfill 700 and extends to the top surface 512T of the integrated circuit die 512. In greater details, the extension portion 710C is in contact with the sidewall 512S of the integrated circuit die 512 and the sidewall 514S2 of the integrated circuit die 514. In some embodiments, an entirety of the sidewall 512S of the integrated circuit die 512 may be covered by the extension portion 710C of the underfill 710 and the extension portion 700B of the underfill 700. For example, the lower section of the sidewall 512S of the integrated circuit die 512 is covered by the extension portion 700B of the underfill 700, while the upper section of the sidewall 512S of the integrated circuit die 512 is covered by the extension portion 710C of the underfill 710. Furthermore, the extension portion 710C of the underfill 710 extends from the upper section of the sidewall 512S of the integrated circuit die 512 to the top surface 512T of the integrated circuit die 512.

In some embodiments, an entirety of the surface 702 of the extension portion 700B of the underfill 700 is in contact with the underfill 710, and thus the surface 702 of the extension portion 700B can also be referred to as the interface between the extension portion 710C of the underfill 710 and the extension portion 700B of the underfill 700.

The extension portion 710C may include a lateral width W3. Here, the "laterally width" of the extension portion 710C may be defined as a lateral distance between the vertical sidewall 514S2 of the integrated circuit die 514 and a farthest end of the extension portion 710C from the sidewall 514S2 of the integrated circuit die 514. In some embodiments, the lateral width W3 of the extension portion 710C of the underfill 710 may be greater than the lateral width W1 of the extension portion 700B of the underfill 700. In some embodiments, the extension portion 710C may have a curved surface 714 extending from the sidewall 514S2 of the integrated circuit die 514 to the top surface 512T of the integrated circuit die 512. That is, one end of the curved surface 714 of the extension portion 710C is in contact with the sidewall 514S2 of the integrated circuit die 514, and the other end of the curved surface 714 of the extension portion 710C is in contact with the top surface 512T of the integrated circuit die 512. In some embodiments, the curved surface 714 of the extension portion 710C is a concave surface. The top most end of the extension portion 710C of the underfill 710 may be higher than the top most end of the extension portion 710B of the underfill 710. In some embodiments, the curved surface 714 of the extension portion 710C is higher than the curved surface 712 of the extension portion 710B. In some embodiments, the curved surface 714 of the extension portion 710C is higher than the top surface 512T of the integrated circuit die 512 and is below the top surface 514T of the integrated circuit die 514.

As mentioned above with respect to the underfill 700, the extension portions 700B and 700C of the underfill 700 may include substantially symmetrical profiles. However, the extension portions 710B and 710C of the underfill 710 may include asymmetrical profiles. Stated another way, the profiles of the extension portions 700B and 700C of the underfill 700 are more symmetrical than the profiles of the extension portions 710B and 710C of the underfill 710.

The integrated circuit die 512 and the integrated circuit die 514 are separated from each other by a lateral distance D1. Here, the lateral distance D1 may be defined as the lateral distance between the sidewall 512S of the integrated circuit die 512 and the sidewall 514S2 of the integrated circuit die 514. In some embodiments, the lateral distance D1 may be smaller than the sum of the lateral width W1 of the extension portion 700B of the underfill 700 and the lateral width W2 of the extension portion 710B of the underfill 710. In some embodiments, the integrated circuit die 514 is separated from the extension portion 700B of the underfill 700 by a lateral distance D2. Here, the lateral distance D2 may be defined as the lateral distance between the sidewall 514S2 of the integrated circuit die 514 and the closest end of the extension portion 700B of the underfill 700 to the sidewall 514S2 of the integrated circuit die 514. In some embodiments, the lateral distance D2 has a non-zero value. This means the extension portion 700B of the underfill 700 does not extend to a position vertically below the integrated circuit die 514.

The integrated circuit die 514 includes a height H2. Here, the "height" of the integrated circuit die 514 may be defined as a vertical distance between the top surface 514T of the integrated circuit die 514 and a top surface of the package substrate 100. In some embodiments, the height H2 of the integrated circuit die 514 is greater than about 9-11 times (e.g., 10 times) the lateral width W2 of the extension portion 710B of the underfill 710.

The integrated circuit dies 512 and 514 has a height difference H3. Here, the "height difference" between the integrated circuit dies 512 and 514 may be defined as a vertical distance between the top surface 514T of the integrated circuit die 514 and the top surface 512T of the integrated circuit die 512. In some embodiments, the height difference H3 between the integrated circuit dies 512 and 514 is greater than about 9-11 times (e.g., 10 times) the lateral width W3 of the extension portion 710C of the underfill 710.

In some embodiments, the integrated circuit die 512 may be disposed on the package substrate 100 prior to disposing the integrated circuit die 514 on the package substrate 100. If the integrated circuit die 514 is disposed on the package substrate 100 prior to disposing the integrated circuit die 512, the extension portion 710C of the underfill 710 may extend to a position where the integrated circuit die 512 will be disposed, which will adversely affect the placement of the integrated circuit die 512. Thus, the integrated circuit die 514 may be disposed on the package substrate 100 after the integrated circuit die 512 is disposed on the package substrate 100 and after the underfill 700 is formed.

Figure 11:
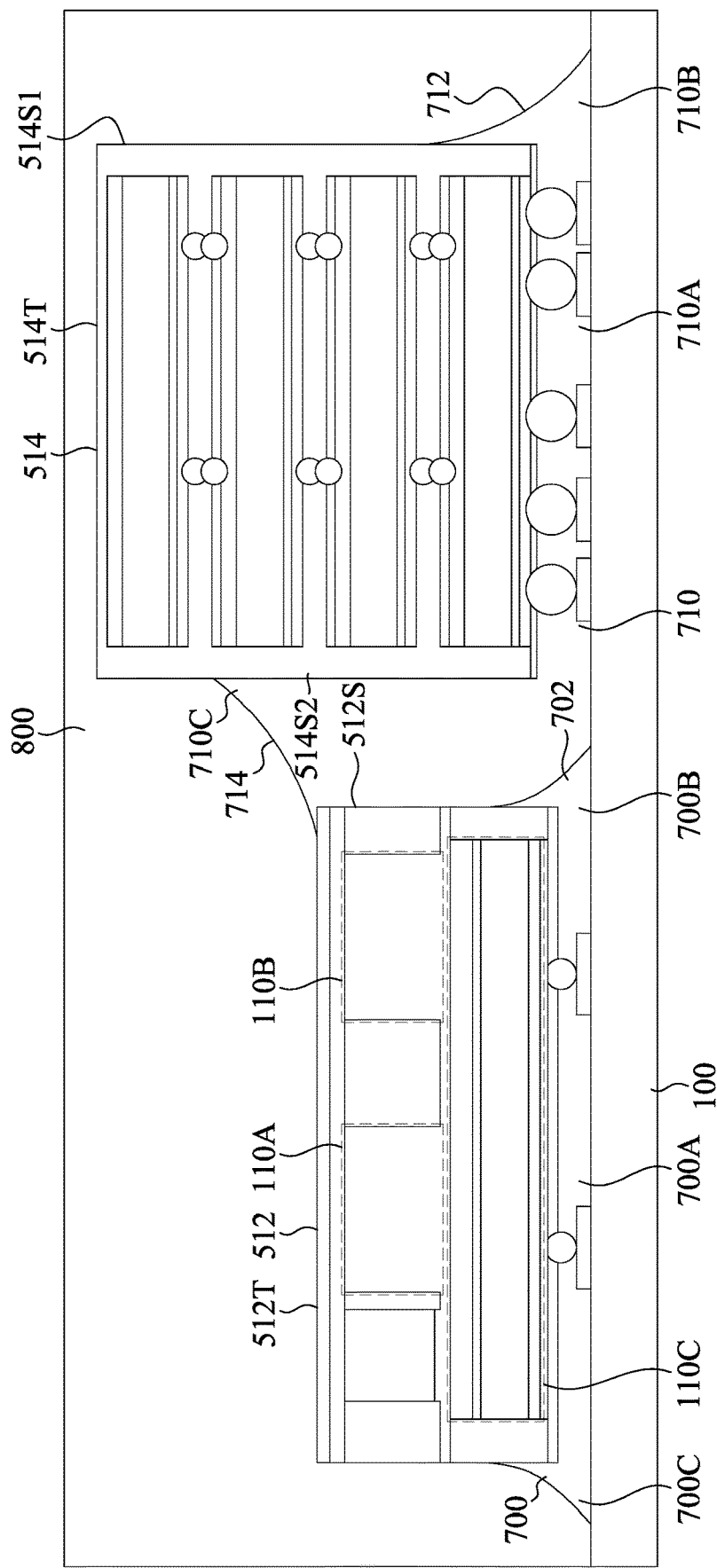

Reference is made to FIG. 11. A molding material 800 is formed over the package substrate 100 to encapsulate the first and second integrated circuit dies 512, 514. In some embodiments, the molding material 800 may cover and be in contact with sidewalls and top surfaces of the first and second integrated circuit dies 512, 514, except for the sidewall 512S of the first integrated circuit die 512. The molding material 800 may also cover and be in contact with the extension portion 700C of the underfill 700 and the extension portions 710B, 710C of the underfill 710. That is, the molding material 800 may form interfaces with the extension portion 700C of the underfill 700 and the extension portions 710B, 710C of the underfill 710. In some embodiments, the molding material 800 may be separated from the extension portion 700B of the underfill 700 by the extension portion 710C of the underfill 710. In some embodiments, the molding material 175 may include organic polymer, molding compound, epoxy, an underfill, a molding underfill, the like, or a combination thereof and may be applied by compression molding, transfer molding, or the like, or other suitable methods.

Figure 12:
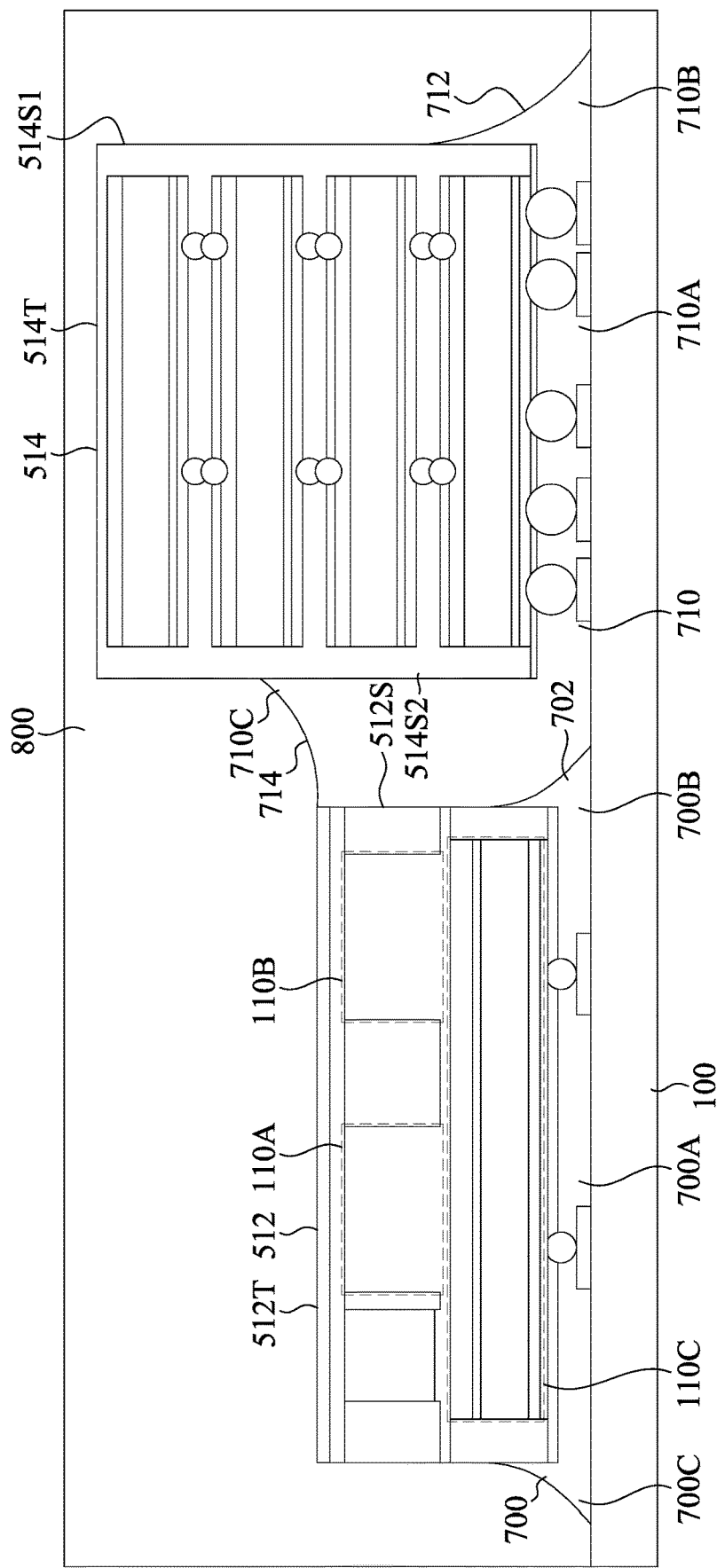
FIG. 12 illustrates a cross-sectional view of a package structure in accordance with some embodiments.

FIG. 12 illustrates a cross-sectional view of a package structure in accordance with some embodiments. It is understood that some elements of FIG. 12 may be similar or the same as those described with respect to FIGS. 1A to 11, and thus relevant structural details will not be repeated for simplicity. FIG. 12 is different from FIG. 11, in that the extension portion 710C of the underfill 710 covers the sidewall 512S of the integrated circuit die 512, while the extension portion 710C of the underfill 710 does not extends to the top surface 512T of the integrated circuit die 512. Accordingly, an entirety of the top surface 512T of the integrated circuit die 512 may be covered by the molding material 800, and may be free from coverage by the extension portion 710C of the underfill 710. In some embodiments, the bottommost end of the curved surface 714 of the extension portion 710C may be substantially level with the top surface 512T of the integrated circuit die 512.

Figure 13:
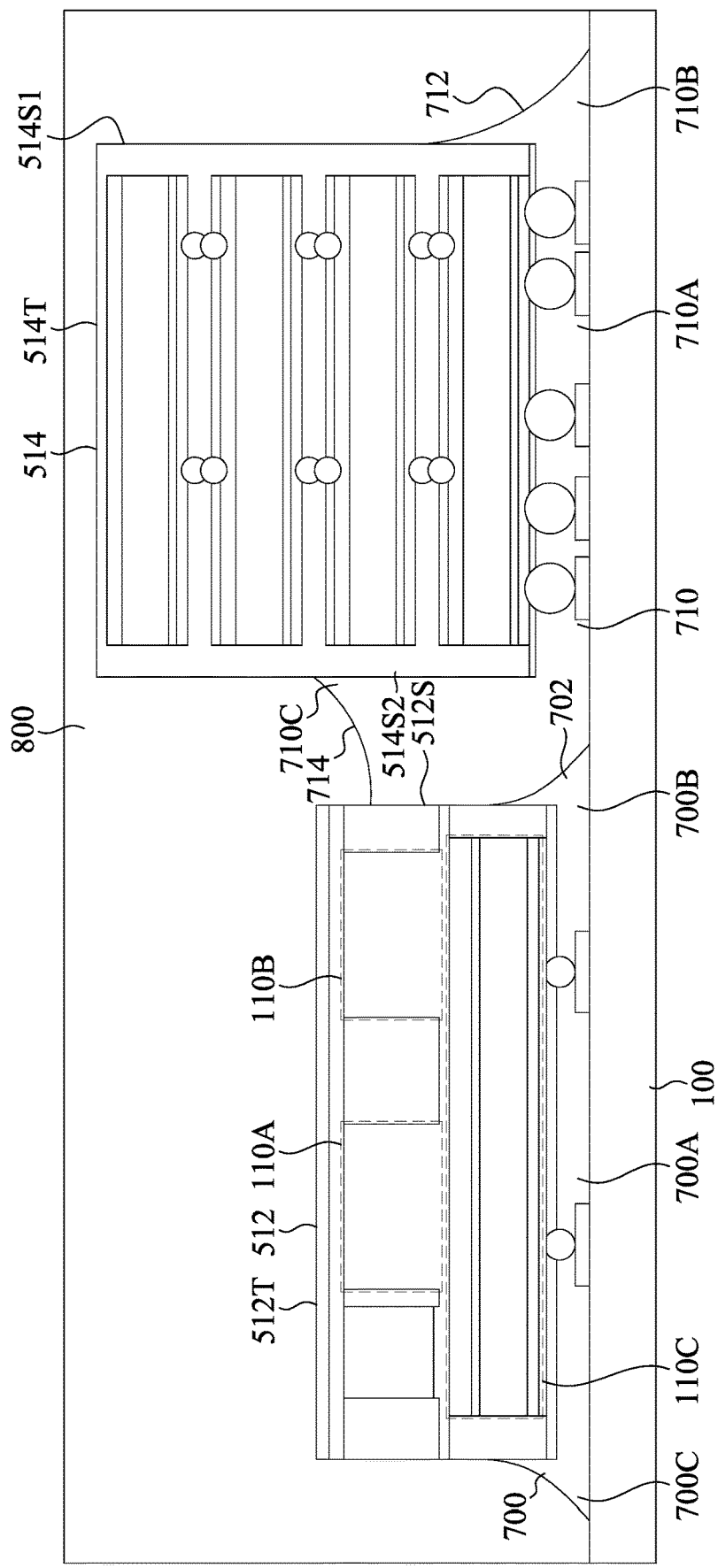
FIG. 13 illustrates a cross-sectional view of a package structure in accordance with some embodiments.

FIG. 13 illustrates a cross-sectional view of a package structure in accordance with some embodiments. It is understood that some elements of FIG. 13 may be similar or the same as those described with respect to FIGS. 1A to 11, and thus relevant structural details will not be repeated for simplicity. FIG. 13 is different from FIG. 11, in that the extension portion 710C of the underfill 710 covers a portion of the sidewall 512S of the integrated circuit die 512. In greater details, the lower portion of the sidewall 512S of the integrated circuit die 512 is covered by the extension portion 700B of the underfill 700, the middle portion of the sidewall 512S of the integrated circuit die 512 is covered by the extension portion 710C of the underfill 710, and the upper portion of the sidewall 512S of the integrated circuit die 512 is covered by the molding material 800. In some embodiments, the bottommost end of the curved surface 714 of the extension portion 710C may be lower than the top surface 512T of the integrated circuit die 512.

Figure 14:
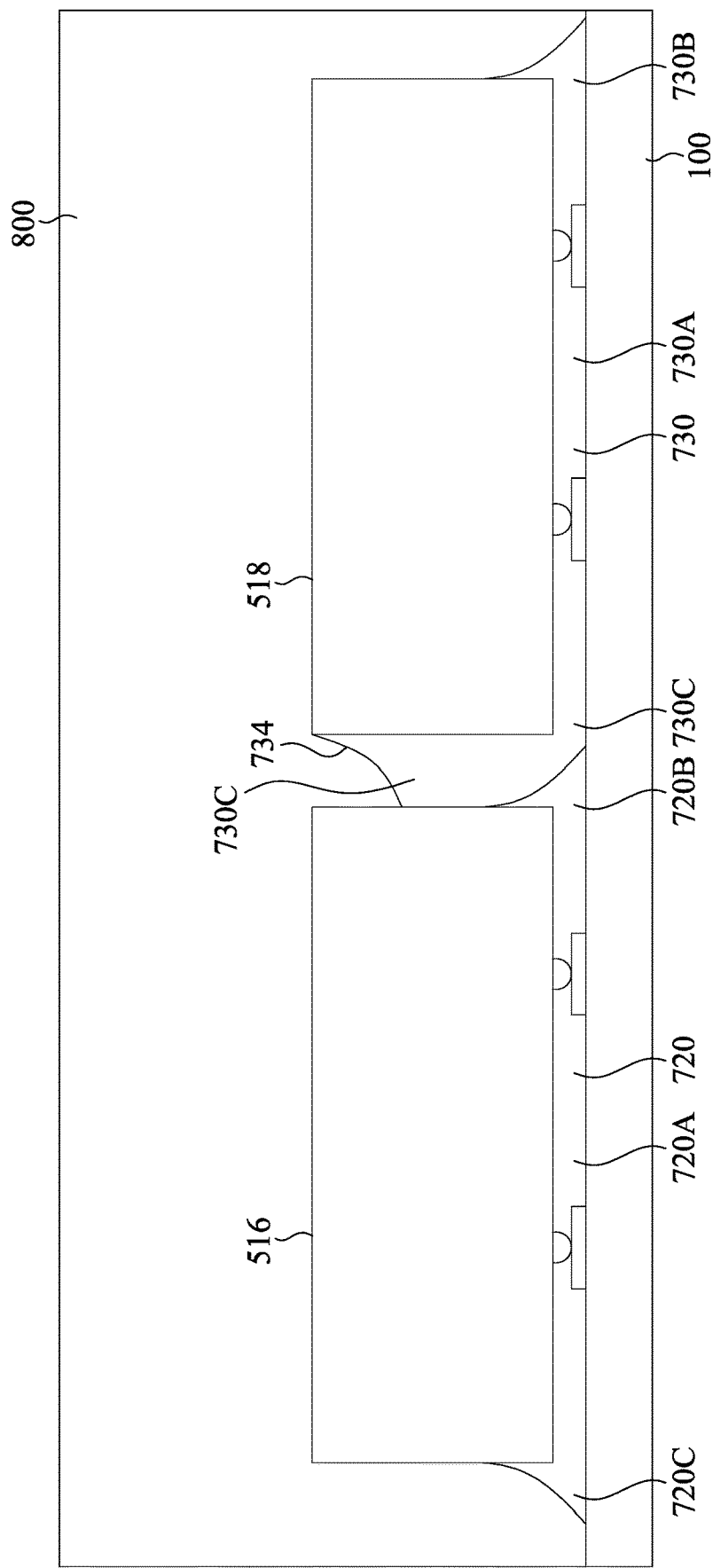
FIG. 14 illustrates a cross-sectional view of a package structure in accordance with some embodiments.

FIG. 14 illustrates a cross-sectional view of a package structure in accordance with some embodiments. It is understood that some elements of FIG. 14 may be similar or the same as those described with respect to FIGS. 1A to 11, and thus relevant structural details will not be repeated for simplicity.

In FIG. 14, integrated circuit dies 516 and 518 are disposed on a package substrate 100. In some embodiments, the integrated circuit dies 516 and 518 may be the same. For example, the integrated circuit dies 516 and 518 may both have structures similar to the integrated circuit die 512 described above, or may both have structures similar to the integrated circuit die 514 described above. That is, the integrated circuit dies 516 and 518 may have substantially the same height.

An underfill 720 is between the integrated circuit die 516 and the package substrate 100. The underfill 720 may include a filling portion 720A and extension portions 720B, 720C on opposite sides of the filling portion 720A. An underfill 730 is between the integrated circuit die 518 and the package substrate 100. The underfill 730 may include a filling portion 730A and extension portions 730B, 730C on opposite sides of the filling portion 730A. The extension portion 730C of the underfill 730 may cover the extension portion 720B of the underfill 720. In some embodiments, the extension portion 730C may cover an entirety of the extension portion 720B of the underfill 720. The extension portion 730C of the underfill 730 may be in contact with a sidewall of the integrated circuit die 516, while an upper portion of the sidewall of the integrated circuit die 516 may be free from coverage by the extension portion 730C of the underfill 730. In some embodiments, the top surface of the extension portion 730C of the underfill 730 may be lower than top surfaces of the integrated circuit dies 516 and 518, and may be higher than the top surface of the extension portion 730B of the underfill 730.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that a first die with lower height is disposed on a package substrate prior to disposing a second die with greater height, and a distance between the first and second dies may be narrowed, so as to increase package density of the package substrate.

In some embodiments of the present disclosure, a package structure includes a package substrate, a first die, a second die, a first underfill, and a second underfill. The first die and a second die are disposed on the package substrate. The first underfill is between the first die and the package substrate, and the first underfill includes a first extension portion extending from a first sidewall of the first die toward the second die. The second underfill is between the second die and the package substrate, and the second underfill includes a second extension portion extending from a second sidewall of the second die toward the first die, the second extension portion overlapping the first extension portion on the package substrate.

In some embodiments of the present disclosure, a package structure includes a package substrate, a first die, a second die, a first underfill, and a second underfill. The first underfill is between the first die and the package substrate, the first underfill includes a first extension portion extending from a first sidewall of the first die toward the second die, and a second extension portion extending away from a second sidewall of the first die opposite to the first sidewall of the first die. The second underfill is between the second die and the package substrate, the second underfill includes a third extension portion extending from a third sidewall of the first die toward the first die, and a fourth extension portion extending away from a fourth sidewall of the first die opposite to the third sidewall of the second die, in which a topmost end of the third extension portion is higher than a topmost end of the fourth extension portion.

In some embodiments of the present disclosure, a method includes placing a first die over a package substrate; dispensing a first underfill between the first die and the package substrate, in which the first underfill has a first extension portion extending away from a first sidewall of the first die; after dispensing the first underfill, placing a second die over the package substrate; and placing a second underfill between the first die and the package substrate, in which the second underfill has a second extension portion extending from a second sidewall of the second die toward the first die, and the second extension portion is in contact with the first extension portion of the first underfill and the first sidewall of the first die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   placing a first die over a package substrate;
   dispensing a first underfill between the first die and the package substrate, wherein the first underfill has a first extension portion extending away from a first sidewall of the first die;
   after dispensing the first underfill, placing a second die over the package substrate; and
   placing a second underfill between the second die and the package substrate, wherein the second underfill has a second extension portion extending from a second sidewall of the second die toward the first die, and the second extension portion is in contact with the first extension portion of the first underfill and the first sidewall of the first die.

2. The method of claim 1, further comprising molding the first and second dies in a molding material, wherein the molding material is separated from the first extension portion of the first underfill by the second extension portion of the second underfill.

3. The method of claim 1, wherein the second extension portion is in contact with a top surface of the first die.

4. A method, comprising:
placing a first die over a package substrate;
forming a first underfill between the first die and the package substrate, the first underfill comprising a first extension portion extending away from a first sidewall of the first die;
placing a second die over the package substrate; and
forming a second underfill between the second die and the package substrate, the second underfill comprising a second extension portion extending from a second sidewall of the second die toward the first die, the second extension portion vertically overlapping the first extension portion on the package substrate, wherein the second extension portion of the second underfill further extends along the second sidewall of the second die and terminates prior to reaching a top surface of the second die.

5. The method of claim 4, wherein a top surface of the second die is higher than the top surface of the first die.

6. The method of claim 4, wherein a lower portion of the first sidewall of the first die is covered by the first extension portion of the first underfill, and an upper portion of the first sidewall of the first die is covered by the second extension portion of the second underfill.

7. The method of claim 4, wherein the first extension portion of the first underfill has a concave surface having a first end at a top surface of the package substrate and a second end at the first sidewall of the first die, and wherein the first end of the concave surface of the first extension portion of the first underfill is laterally spaced apart from the second sidewall of the second die by a non-zero distance.

8. The method of claim 7, wherein an entirety of the concave surface of the first extension portion of the first underfill is covered by the second extension portion of the second underfill.

9. The method of claim 4, wherein the second underfill further comprises a third extension portion extending away from a third sidewall of the second die opposite to the second sidewall of the second die, and wherein a topmost end of the second extension portion is higher than a topmost end of the third extension portion.

10. The method of claim 9, wherein the first extension portion has a first lateral width, the third extension portion has a second lateral width, and the first lateral width is less than the second lateral width.

11. The method of claim 9, wherein the first extension portion has a first lateral width, the third extension portion has a second lateral width, and a sum of the first and second lateral width is greater than a lateral distance between the first sidewall of the first die and the second sidewall of the second die.

12. The method of claim 4, further comprising forming a molding material covering the first and second dies.

13. The method of claim 12, wherein the molding material is separated from the first sidewall of the first die by a combination of the first underfill and the second underfill.

14. A method, comprising:
placing a first die over a package substrate;
forming a first underfill between the first die and the package substrate, the first underfill comprising a first extension portion extending away from a first sidewall of the first die, and a second extension portion extending away from a second sidewall of the first die opposite to the first sidewall of the first die;
placing a second die over the package substrate; and
forming a second underfill between the second die and the package substrate, the second underfill comprising a third extension portion extending from a third sidewall of the second die toward the first die, and a fourth extension portion extending away from a fourth sidewall of the second die opposite to the third sidewall of the second die, wherein a topmost end of the third extension portion is higher than a topmost end of the fourth extension portion.

15. The method of claim 14, wherein the third extension portion extends to a top surface of the first die.

16. The method of claim 14, wherein the third extension portion of the second underfill covers the first extension portion of the first underfill.

17. The method of claim 14, wherein a height difference between the topmost ends of the third and fourth extension portions of the second underfill is greater than a height difference between topmost ends of the first and second extension portions of the first underfill.

18. The method of claim 14, further comprising forming a molding material covering the first and second dies.

19. The method of claim 14, wherein profiles of the first and second extension portions of the first underfill are more symmetric than profiles of the third and fourth extension portions of the second underfill.

20. The method of claim 4, wherein the second extension portion is in contact with a top surface of the first die.

* * * * *